United States Patent [19]
Wyland et al.

[11] Patent Number: 5,962,924
[45] Date of Patent: Oct. 5, 1999

[54] SEMI-CONDUCTOR DIE INTERCONNECT

[75] Inventors: Christopher Paul Wyland, Morgan Hill; Atlantico S. Medina, Fremont, both of Calif.

[73] Assignee: Integrated Device Technology, Inc., Santa Clara, Calif.

[21] Appl. No.: 09/135,864

[22] Filed: Aug. 17, 1998

Related U.S. Application Data

[62] Division of application No. 08/795,183, Feb. 4, 1997, Pat. No. 5,897,335.

[51] Int. Cl.$^6$ ..................................................... H01L 23/48
[52] U.S. Cl. ......................... 257/778; 257/737; 257/734; 257/785; 438/108
[58] Field of Search .................................. 257/731, 732, 257/733, 734, 773, 777, 778, 779, 738, 698, 737, 785, 730; 439/74; 438/108

[56] References Cited

U.S. PATENT DOCUMENTS

| | | | |
|---|---|---|---|
| 3,808,506 | 4/1974 | Lang | 317/101 D |
| 3,811,186 | 5/1974 | Larnerd et al. | 29/626 |
| 4,080,026 | 3/1978 | Gianni | 339/17 CF |
| 4,668,032 | 5/1987 | Bouvier et al. | 339/17 CF |
| 4,949,148 | 8/1990 | Bartelink | 357/74 |
| 5,061,989 | 10/1991 | Yen et al. | 357/74 |
| 5,073,117 | 12/1991 | Malhi et al. | 439/74 |
| 5,121,299 | 6/1992 | Frankeny et al. | 361/413 |
| 5,157,480 | 10/1992 | McShane et al. | 357/74 |
| 5,273,440 | 12/1993 | Ashman et al. | 439/71 |
| 5,299,939 | 4/1994 | Walker et al. | 439/74 |
| 5,342,207 | 8/1994 | Sobhani | 439/74 |
| 5,411,400 | 5/1995 | Subrahmanyan et al. | 439/68 |
| 5,415,555 | 5/1995 | Sobhani | 439/74 |
| 5,419,710 | 5/1995 | Pfaff | 439/266 |
| 5,570,273 | 10/1996 | Siegel et al. | 361/773 |
| 5,646,442 | 7/1997 | Abe et al. | 257/697 |
| 5,675,889 | 10/1997 | Acocella let al. | 29/830 |

Primary Examiner—Tom Thomas
Assistant Examiner—Luan Thai
Attorney, Agent, or Firm—Skjerven, Morrill, MacPherson, Franklin & Friel

[57] ABSTRACT

An improved flip-chip bond connection and bonding method uses a "press fit" bond between a set of bond pad bumps or projections on a semiconductor chip and corresponding set of substrate bumps or projections on a substrate to self-align the chip with the substrate and enable flip-chips to be inexpensively bonded to substrates or packages with greater accuracy and a smaller pad pitch than previously achieved. In the method after normally one of the sets of bond pad bumps or substrate bumps has been cooled to shrink or contract so that the facing surfaces of each of the pad bumps and substrate bumps can be interdigitated, the chip and substrate are moved together so that the respective bumps are in a substantially common plane. The one cooled set of bumps is then warmed to expand that set of bumps sufficiently to form a lateral press-fit force between the facing surfaces, physically securing and electrically connecting the respective sets of bumps.

17 Claims, 2 Drawing Sheets

SEMI-CONDUCTOR DIE INTERCONNECT

This application is a division of application Ser. No. 08/795,183, filed Feb. 4, 1997, U.S. Pat. No. 5,897,335.

FIELD OF THE INVENTION

This invention relates to an improved flip-chip press fit bond and bonding method which allows flip-chips to be inexpensively bonded to substrates or packages with greater accuracy and a smaller pad pitch than heretofore achieved.

BACKGROUND OF THE INVENTION

An integrated circuit or "chip" is commonly contained in a "package" which provides both physical protection for the chip and electrical connections to connect the chip to external circuitry. Rather than placing individual chips in separate packages, however, it is possible to increase circuit density by using a multichip technology such as "flip-chip" technology to mount multiple chips closely together on a common substrate which interconnects the chips. The substrate may be made, for example, of silicon or of ceramic having a thermal expansion coefficient matching that of silicon, in order to reduce stress-induced breakage caused by the chip and the substrate expanding and contracting at different rates.

In flip-chip technology, an array of raised conductive "bumps" such as small solder balls is first formed on the contact pads ("die bond pads") on the face of a die. The die is then inverted or "flipped" and placed face down on a substrate so that the die bond pads are aligned with corresponding contact pads on the substrate ("substrate bond pads"). The solder is then reflowed to electrically and physically connect ("bond") the chip to the substrate.

A primary advantage of flip-chip technology is that, since no wire leads are required to connect the chips to the substrate, the chips may be placed very close together. This maximizes circuit density and increases the signal speed by minimizing the interconnection delay between the chips. However, a disadvantage of flip-chip technology is that the chip is bonded to the substrate by placing the solder bumps on the chip contact pads directly over the substrate contact pads to which they are to be bonded. Since the chip is placed face down on the substrate, the solder bumps are not visible during the bonding operation and a certain tolerance in the placement of the chip on the underlying substrate is required to ensure proper placement of the solder bumps on the underlying substrate contact pads. This tolerance increases the distance which must be allowed between adjacent chips mounted on the same substrate. In addition, this lack of visibility results in some of the chip solder bumps not being sufficiently in contact with the underlying substrate contact pads, thus decreasing the yield.

SUMMARY OF THE INVENTION

In accordance with the present invention, an improved flip-chip press fit bond and bonding method allows flip-chips to be inexpensively bonded to substrates or packages with greater accuracy and a smaller pad pitch than previously achieved. Because the substrate bumps in this invention protrude from the substrate and physically contact the bond pad bumps on the chip, this will result in the chip being automatically self-aligned with the underlying substrate bumps, thereby substantially reducing the spacing required between adjacent chips mounted on the same substrate. Thus, this invention will overcome the alignment problem of the prior art by allowing the chips to be properly aligned or "snapped" into the appropriate position when the underlying substrate bumps are in proper contact with the bond pad bumps on the chip. Moreover, because each chip will be correctly mounted in relation to the underlying substrate bumps, each bump on the chip will be in proper electrical contact with the underlying bump on the substrate, thereby reducing the yield loss experienced with conventional flip-chips due to miscontact between the chip solder bumps and the underlying substrate contact pads.

DETAILED DESCRIPTION

Figure 1:
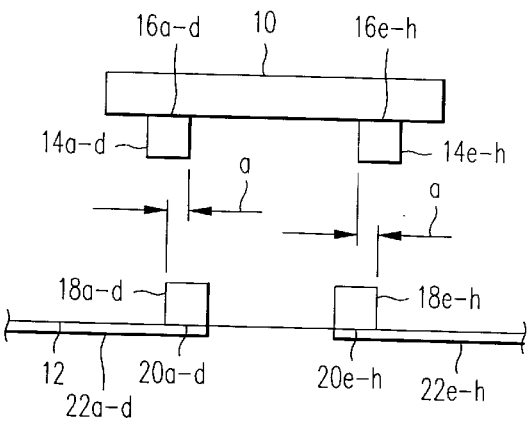
FIG. 1 is a side view of one embodiment of an integrated circuit before being attached to a substrate in accordance with this invention.

FIG. 1 is a side view of one embodiment of an integrated circuit or "chip" 10 before being attached to a substrate 12 in accordance with the present invention.

In accordance with this invention, any substrate appropriate for use in mounting an integrated circuit chip is appropriate for use with this invention. However, a substrate with a thermal expansion coefficient matching that of the chip 10 is preferred. Such a substrate may be silicon or any other material appropriate for the placement of contact pads or traces in some embodiments having a thermal expansion coefficient close to or approximately equal to that of the chip 10 over the expected range of operating temperatures of from about −55° C. to about 70° C., and having appropriate electrical properties. The preferred range of the thermal expansion coefficient is from about $2 \times 10^{-6}$ (2 ppm per °C.) to $5 \times 10^{-6}$ (2 ppm per °C.). Typically, substrate 12 is an insulator such as a nonconductive ceramic or an appropriate nonconductive printed circuit board such as FR-4 material or DUROID® material or BT resin.

Figure 2:
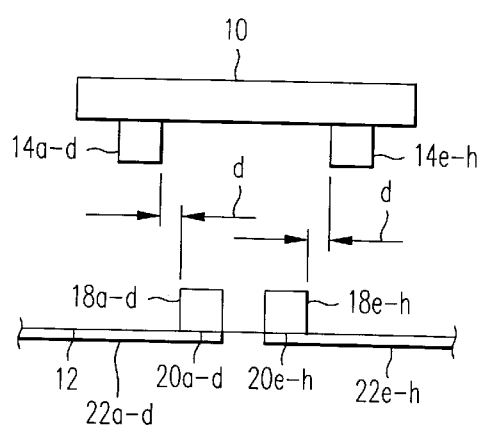
FIG. 2 is a side view of the integrated circuit after the substrate is cooled but before the integrated circuit is attached to the substrate.
Figure 3:
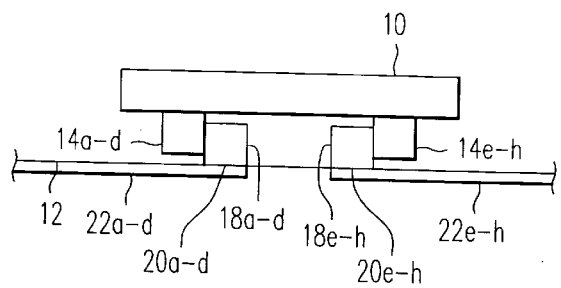
FIG. 3 is a side view of the integrated circuit after it is attached to the substrate.
Figure 4:
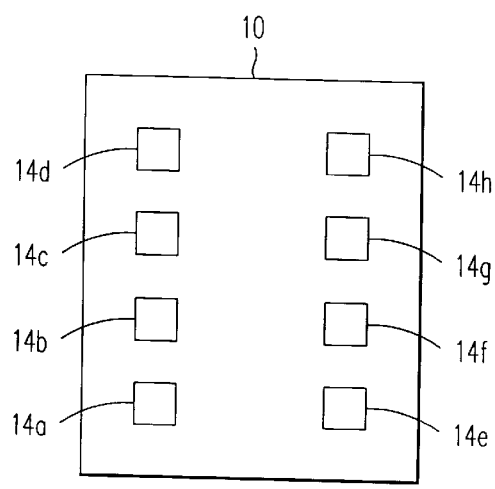
FIG. 4 is a bottom view of the integrated circuit showing two rows of die bond pad bumps.

In one embodiment, two rows of die bond pad bumps or projections 14a–d and 14e–h are formed by conventional processing techniques on the contact pads 16a–d and 16e–h on the face of the chip 10 (FIG. 4). Although the embodiment of FIGS. 1–4 shows the die bond pad bumps as having a rectangular cross section, bumps having various cross sections which can be brought into abutment can be used. Since the die bond pad bumps of this invention can be formed using a photolithographic process, it is contemplated that the cross-sectional dimensions of the die bond pad bumps are reduced to, e.g., 30–40 microns on each side, as contrasted with conventional solder bumps which are typically 60–75 microns or more in diameter. The substantial reduction in bond pad pitch in this invention will significantly increase the yield.

Substrate bumps or projections 18a–h constructed of typically gold material are formed by conventional processing techniques on the substrate contact pads 20a–h on the substrate 12. Both the die bond pad bumps 14a–h and the substrate bumps 18a–h are substantially rigid and preferably are formed of material having a thermal expansion coefficient matching that of the chip 10 and the substrate 12, in order to decrease the stress caused by the chip and the substrate expanding and contracting at different rates. "Substantially rigid" as used herein means that the bumps are not springy or capable of movement other than by expansion and contraction due to temperature changes. Also, it is contemplated to use a relatively soft material to form the bond pad bumps 14a–h and the substrate bumps 18a–h, to provide ductile relief and thereby further reduce such stress. Typically the bumps have a height of from about 0.025 mm to about 0.1 mm and a maximum width of from about 0.02 mm to about 0.1 mm. The substrate and die are moved relative to each other so that the respective bumps are in a substantially common plane and spaced from each other. Overlap dimensions "a" in FIG. 1 (e.g., the overlap between the row of die bond pad bumps 14a–d and the row of substrate bumps 18a–d) are selected to result in appropriate clearance dimensions "d" (FIG. 2) after the substrate 12 is cooled as described below. Dimension "a" is typically in a range of from about 0.001 mm to about 0.05 mm while dimension "d" is in a range of from about 0.02 mm to about 0.1 mm.

The substrate 12 is then cooled preferably to about −150° C. to −100° C. to "shrink" or move the two rows of substrate bumps 18a–d and 18e–h closer together so that the two rows of substrate bumps will "fit inside" the corresponding two rows of bond pad bumps 14a–d and 14e–h. For example, liquid nitrogen or another appropriate coolant can be used to cool the substrate to an appropriate temperature. FIG. 2 is a side view of the chip 10 after the substrate 12 is cooled but before the chip 10 is attached to substrate 12 in accordance with the present invention. Dimensions "d" in FIG. 2 (e.g., the clearance between the row of die bond pad bumps 14a–d and the row of substrate bumps 18a–d) are selected (a) to provide adequate clearance for mounting the chip 10 on the substrate 12 and (b) to provide an appropriate amount of tension (after the substrate 12 is allowed to return to ambient temperature) to create a "press fit" bond between the bond pad bumps 14a–d and the corresponding substrate bumps 18a–d, but (c) to limit such tension to an acceptable level in order to prevent stress-induced breakage. In this regard, it should be noted that, in addition to cooling the substrate 12 to "shrink" the substrate, it may be desirable to warm the chip 10 to "expand" the chip to produce the appropriate clearance dimensions "d". As shown in FIG. 2, the chip 10 is then aligned with the substrate 12 using conventional alignment techniques so that the row of bond pad bumps 14a–d is offset laterally from the row of substrate bumps 18a–d, thus allowing the chip 10 to be moved toward the substrate 12 and mounted on the substrate 22.

The substrate 12 is then allowed to return to ambient temperature, so that the substrate 12 expands and the row of substrate bumps 18a–d moves laterally to form a "press fit" with the row of die bond pad bumps 14a–d while the row of substrate bumps 18e–h similarly forms a press fit with the row of die bond pad bumps 14e–h. Thus, this invention will allow the chip 10 to be properly aligned or "snapped" into the appropriate position when the two rows of substrate bumps form press fit bonds with the corresponding two rows of bond pad bumps on the chip. The press fit results in the chip 10 being automatically self-aligned in one dimension (e.g., in the x-direction) with the underlying substrate bumps, thereby substantially reducing the spacing required between adjacent chips mounted on the same substrate. FIG. 3 is a side view of the chip 10 after it is mounted on the substrate 12 according to the invention. Substrate bumps 18a–h are formed on conductive leads or "traces" 22a–h formed on the substrate 12. Conductive leads 22a–h interconnect the chip 10 with external circuitry (not shown).

FIG. 4 is a bottom view of the chip 10 showing two rows 14a–e and 14e–h of die bond pad bumps. In the embodiment of FIG. 4, the bond pad bumps form a peripheral array (arranged around the periphery of the chip). However, the present invention will permit various arrays of bond pad bumps to be used, as long as the appropriate amount of tension is provided as described above to create a "press fit" between each individual bond pad bump and its corresponding substrate bump.

Figure 5:
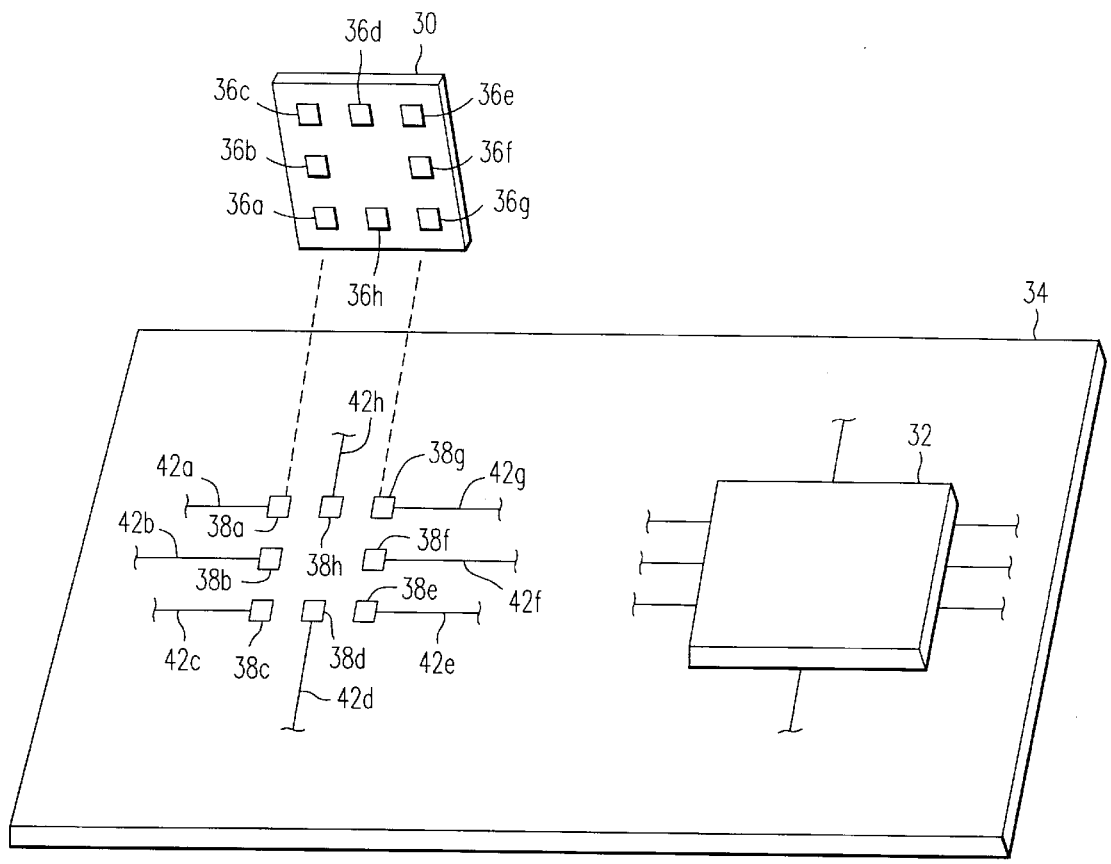
FIG. 5 is a three-dimensional view of an alternative embodiment showing multiple flip-chips being attached to a substrate in accordance with this invention.

FIG. 5 is a three-dimensional view of an alternative embodiment showing multiple flip-chips 30, 32 being attached to substrate 34 in accordance with this invention. Chip 30 is shown above substrate 34 ready to be mounted so that each of the bond pad bumps 36a–h will form a press fit bond with one of the corresponding substrate bumps 38a–h. Traces 42a–h interconnect the chip 30 with external circuitry (not shown). Chip 32 is shown as already mounted on substrate 34, although in practice multiple flip-chips may be mounted either consecutively or simultaneously on a substrate.

In contrast with the embodiment of FIGS. 1–4 (which will result in the chip 10 being self-aligned with the substrate 12 in the x-direction, as described above), the embodiment of FIG. 5 will result in the chip 30 being self-aligned with the substrate 34 in both the x- and y-directions. That is, the two rows of bond pad bumps 36a–c and 36e–g will press fit with the two rows of substrate bumps 38a–c and 38e–g to provide self-alignment also in the x-direction. Additionally, however, the two rows of bond pad bumps 36a,h,g and 36c–e (substantially perpendicular to rows 36a–c and 36e–g) will press fit with the two rows of substrate bumps 38a,h,g and 38c–e to provide self-alignment in the y-direction. Moreover, because the chip 30 will be correctly mounted in relation to the underlying substrate bumps, each bond pad bump on the chip 30 will be in proper electrical contact with the underlying bump on the substrate 34, thereby reducing the yield loss experienced with conventional flip-chips due to miscontact between the chip solder bumps and the underlying substrate contact pads.

The above description is intended to be illustrative and not restrictive. Many variations of the invention will become apparent to those of skill in the art upon review of this disclosure. Merely by way of example, while the invention has been illustrated with regard to multichip packages, it will be apparent to those of skill in the art that the invention may be applied in fabricating single-chip packages. The scope of this invention should, therefore, be determined with reference to the appended claims along with their full scope of equivalents.

What is claimed is:

1. A structure electrically connecting a semiconductor die with a substrate, comprising:
   a semiconductor die;
   a first substantially rigid conductive projection on one surface of the die;
   a substrate; and
   a second substantially rigid conductive projection on one surface of the substrate;
   wherein one of said die or said substrate is adapted to contract upon cooling to provide a lateral offset between the first and second projections, and is further adapted to expand upon heating such that one side of the second projection contacts one side of the first projection, thereby producing a lateral force securing the first projection to the second projection in a force-fit electrical connection.

2. Structure as in claim 1 wherein the substrate comprises an insulative substrate.

3. Structure as in claim 1 wherein the thermal expansion coefficients of the die and the substrate are approximately equal.

4. Structure as in claim 1 wherein the thermal expansion coefficients of the die, the substrate, and the first and second projections are approximately equal.

5. Structure as in claim 1 wherein at least two substantially rigid conductive projections are arranged near the periphery of said die surface.

6. Structure as in claim 1 wherein at least two first rows of substantially rigid conductive projections are arranged on said die surface.

7. Structure as in claim 1 wherein at least two second rows of substantially rigid conductive projections are arranged on said die surface, said second rows being substantially perpendicular to said first rows.

8. A structure for electrically connecting a semiconductor die with a substrate, comprising:

a semiconductor die;

a first pair of substantially rigid bond pad bumps formed on a surface of the die;

a substrate; and a second pair of substantially rigid bond pad bumps formed on a surface of the substrate;

wherein a lateral outside region of one of said first pair of substantially rigid bond pad bumps or said second pair of substantially rigid bond pad bumps is in force-fit contact with a lateral inside region of the other of said first pair of bond pad bumps or said second pair of bond pad bumps.

9. Structure as in claim 8 wherein the substrate comprises an insulative substrate.

10. Structure as in claim 8 wherein the thermal expansion coefficients of the die and the substrate are approximately equal.

11. Structure as in claim 8 wherein the thermal expansion coefficients of the die, the substrate, and the first and second pair of bond pad bumps are approximately equal.

12. Structure as in claim 8 wherein said first pair of bond pad bumps are arranged near the periphery of said die surface.

13. Structure as in claim 8 wherein said force-fit contact is formed by changing a temperature of at least one of said die and said substrate.

14. Structure as in claim 13, wherein said substrate is adapted to contract upon cooling to provide a lateral offset between a lateral inside region of said first pair of bond pad bumps and a lateral outside region of said second pair of bond pad bumps, and said substrate is further adapted to expand upon heating to form a force-fit contact between the lateral inside region of said first pair of bond pad bumps and the lateral outside region of said second pair of bond pad bumps.

15. Structure as in claim 13, wherein said substrate is adapted to expand upon heating to provide a lateral offset between a lateral outside region of said first pair of bond pad bumps and a lateral inside region of said second pair of bond pad bumps, and said substrate is further adapted to contract upon cooling to form a force-fit contact between the lateral outside region of said first pair of bond pad bumps and the lateral inside region of said second pair of bond pad bumps.

16. Structure as in claim 13, wherein said die is adapted to contract upon cooling to provide a lateral offset between a lateral outside region of said first pair of bond pad bumps and a lateral inside region of said second pair of bond pad bumps, and said die is further adapted to expand upon heating to form a force-fit contact between the lateral outside region of said first pair of bond pad bumps and the lateral inside region of said second pair of bond pad bumps.

17. Structure as in claim 13, wherein said die is adapted to expand upon heating to provide a lateral offset between a lateral inside region of said first pair of bond pad bumps and a lateral outside region of said second pair of bond pad bumps, and said die is further adapted to contract upon cooling to form a force-fit contact between the lateral inside region of said first pair of bond pad bumps and the lateral outside region of said second pair of bond pad bumps.

* * * * *